United States Patent
Chen et al.

(10) Patent No.: US 9,162,869 B1
(45) Date of Patent: Oct. 20, 2015

(54) MEMS MICROPHONE PACKAGE STRUCTURE HAVING NON-PLANAR SUBSTRATE AND METHOD OF MANUFACTURING SAME

(71) Applicant: MERRY ELECTRONICS (SHENZHEN) CO., LTD., Shenzhen (CN)

(72) Inventors: Jen-Yi Chen, Taichung (TW); Chao-Sen Chang, Taichung (TW); Chun-Chieh Wang, Taichung (TW); Yong-Shiang Chang, Taichung (TW)

(73) Assignee: MERRY ELECTRONICS (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 14/448,461

(22) Filed: Jul. 31, 2014

(51) Int. Cl.
*H04R 23/00* (2006.01)
*B81B 3/00* (2006.01)
*B81C 1/00* (2006.01)

(52) U.S. Cl.
CPC ............ *B81B 3/0021* (2013.01); *B81C 1/00333* (2013.01); *H04R 23/00* (2013.01); *H04R 2201/003* (2013.01)

(58) Field of Classification Search
CPC .................. H01L 2924/00; H01L 2924/1461; H01L 2224/48227; H01L 2224/32225; H01L 2224/73265; H01L 2924/3025; H04R 19/005; H04R 19/04; H04R 2225/49; H04R 31/006; H04R 19/016; H04R 1/04; H04R 29/004
See application file for complete search history.

(56) References Cited

U.S. PATENT DOCUMENTS

| | | | | |
|---|---|---|---|---|
| 8,620,014 B2 * | 12/2013 | Maekawa et al. | ............. | 381/369 |
| 2008/0219482 A1 * | 9/2008 | Sato | ............... | 381/174 |
| 2009/0218668 A1 * | 9/2009 | Zhe et al. | ...................... | 257/680 |

* cited by examiner

*Primary Examiner* — Roy Potter
*Assistant Examiner* — Paul Patton
(74) *Attorney, Agent, or Firm* — Bacon & Thomas, PLLC

(57) ABSTRACT

A MEMS microphone package structure having a non-planar substrate includes the non-planar substrate, a cover plate, and a sound wave transducer. The non-planar substrate has a carrying bottom portion and a sidewall. The carrying bottom portion has a sound hole. The cover plate covers the non-planar substrate from above and connects to the sidewall. Both the cover plate and the sidewall have a metal layer for shielding the microphone from electromagnetic interference. The sound wave transducer is located corresponding to the sound hole. Hence, the sidewall reinforces the non-planar substrate, such that the carrying bottom portion is thinned without weakening the non-planar substrate, so as to increase the capacity of a back chamber of the microphone without changing the appearance and dimensions of the package structure.

2 Claims, 4 Drawing Sheets

MEMS MICROPHONE PACKAGE STRUCTURE HAVING NON-PLANAR SUBSTRATE AND METHOD OF MANUFACTURING SAME

BACKGROUND OF THE INVENTION

1. Technical Field

The present invention relates to package structures of MEMS microphones, and more particularly, to a MEMS microphone package structure having a non-planar substrate, characterized in that the non-planar substrate is reinforced by a sidewall thereof, such that a carrying bottom portion of the non-planar substrate can be thinned.

2. Description of Related Art

Compared to conventional microphones, MEMS microphones are being widely used in the electronic products due to the advantages of being compact, energy-efficient, and cheap. Referring to FIG. 1, a conventional MEMS microphone package structure 70 comprises a substrate 71. A sound wave transducer 72 and an application-specific integrated circuit (ASIC) 73 are electrically connected thereto and disposed/mounted on the substrate 71. The ASIC 73 is electrically connected to external components by a plurality of electrical connection structures 76 on the substrate 71. The substrate 71 is covered by a cap 74 to protect inside components of the MEMS microphone. As shown in FIG. 1, the substrate 71 of the conventional MEMS microphone package structure 70 carries the stress exerted by the back cover 74, the sound wave transducer 72, and the ASIC 73. As considerations are given to structural strength, the thickness of the substrate 71 cannot be thinning, and it is unfavorable to the current trend toward electro-acoustic products. Besides, the thinning of the MEMS microphone package structure 70 will decrease the volume of a back chamber 75 of the MEMS microphone package structure 70. In view of this, a reduction in the thickness of the substrate 71 is to increase the capacity of the back chamber 75, and further enhance the acoustic performance of the MEMS microphone, such as the sensibility, signal-to-noise ratio, and frequency response of the sound perceived.

BRIEF SUMMARY OF THE INVENTION

In view of the aforesaid drawbacks of the prior art, the primary objective of the present invention is to provide an MEMS microphone package structure to increase the capacity of the back chamber of the microphone without changing the appearance and dimensions of the microphone, and shield the microphone from electromagnetic interference at the same time.

In order to achieve the above and other objectives, the present invention provides an MEMS microphone package structure having a non-planar substrate, comprising the non-planar substrate, a cover plate, and a sound wave transducer. The non-planar substrate has a carrying bottom portion within a sound hole and a sidewall surrounding. The sidewall electrically connects to the top surface of the carrying bottom portion by a first metal layer. The cover plate covers the non-planar substrate and connects to the sidewall. A second metal layer on the cover plate is electrically connected to the first metal layer to shield electromagnetic interference. The sound wave transducer aligns to the sound hole and connects to the top surface of the carrying bottom portion.

The present invention further provides a method of manufacturing an MEMS microphone package structure. The method comprises the steps of: (a) providing a non-planar substrate collection formed by arranging a plurality of non-planar substrates in an array, the non-planar substrates each having a carrying bottom portion and a sidewall surrounding and connecting to a top surface of the carrying bottom portion, the sidewall having a first metal layer, and the carrying bottom portion having a sound hole; (b) mounting a sound wave transducer and an ASIC on the carrying bottom portion of each said non-planar substrate provided in step (a), wherein the sound wave transducer corresponds in position to the sound hole; and (c) providing a cover plate collection formed by arranging a plurality of cover plates in an array, connecting the cover plate collection to the non-planar substrate collection, electrically connecting the first metal layer and the second metal layer, and performing a singulation process.

Therefore, the sidewall reinforces the non-planar substrate, such that the carrying bottom portion is thinned without weakening the non-planar substrate, so as to increase the capacity of a back chamber of the microphone without changing the appearance and dimensions of the package structure.

DETAILED DESCRIPTION OF THE INVENTION

Figure 1:
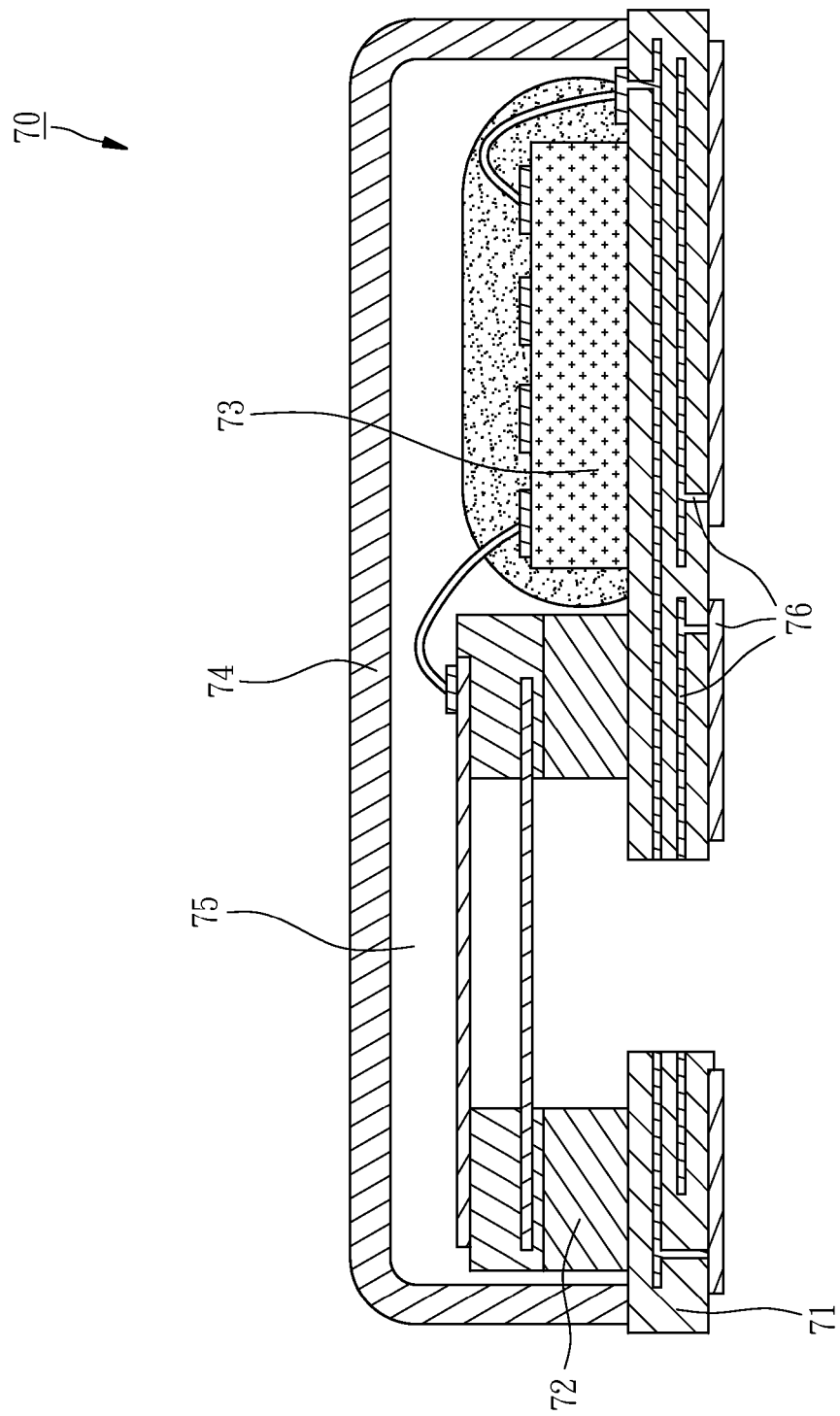
FIG. 1 is a cross-sectional view of a conventional MEMS microphone package structure.
Figure 2:
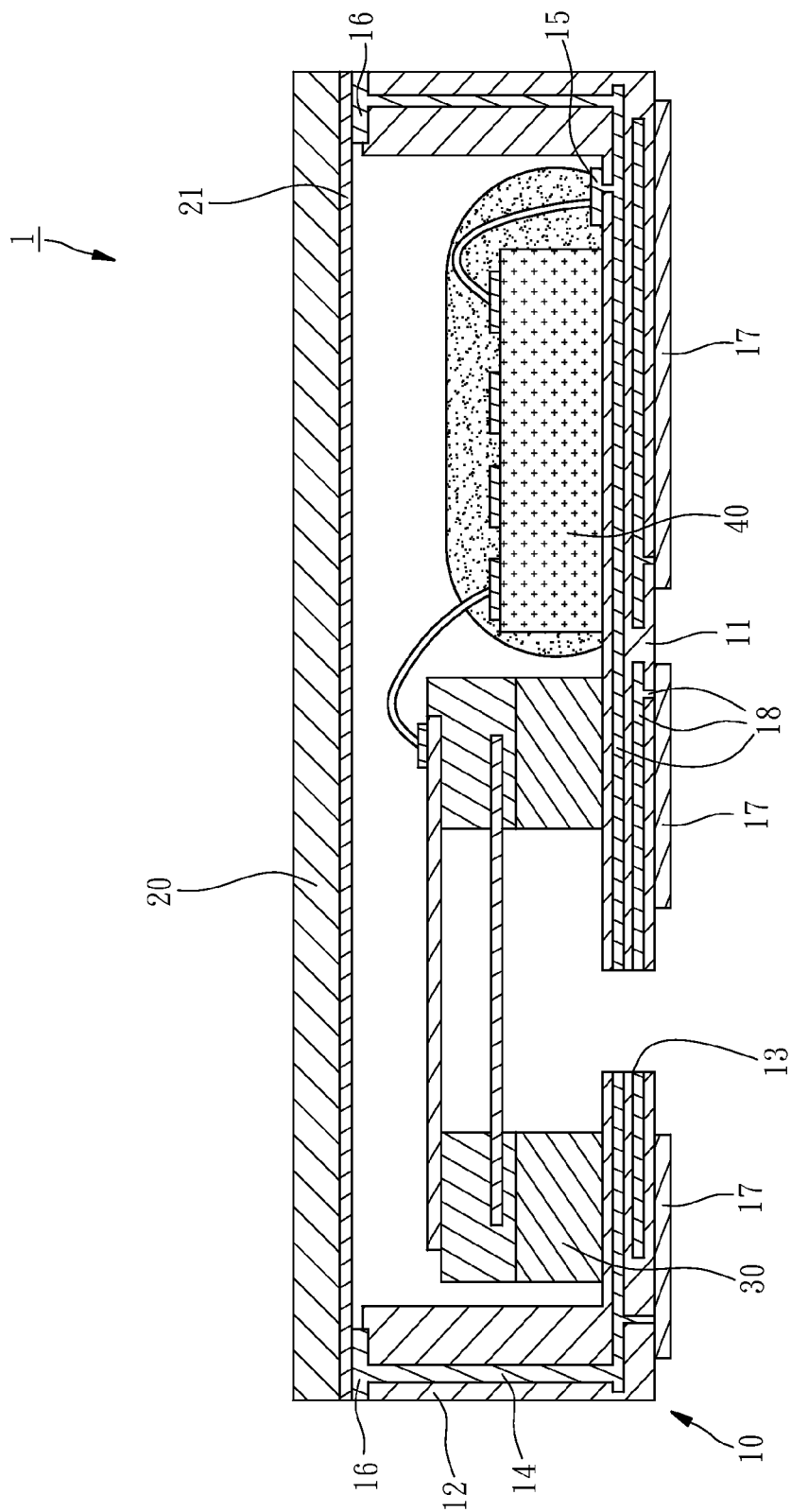
FIG. 2 is a cross-sectional view of an MEMS microphone package structure according to the first embodiment of the present invention.

To allow persons skilled in the art to gain insight into the characteristics of the present invention, the present invention is illustrated with embodiments and described hereunder in conjunction with drawings. Referring to FIG. 2, according to the present invention, an MEMS microphone package structure 1 having a non-planar substrate essentially comprises a non-planar substrate 10, a cover plate 20, and a sound wave transducer 30 whose structures and relationships are described below.

The non-planar substrate 10 has a carrying bottom portion 11 and a sidewall 12 and is made of glass substrate (such as FR-4) or plastic substrate (such as LCP) or integrally formed from a material including but not limited to ceramic. The sidewall 12 is formed by extending the top surface of the carrying bottom portion 11 upward and circumferentially. A plurality of electrodes 15 and metal bumps 17 are disposed on the top surface and the bottom surface of the carrying bottom portion 11, respectively. The carrying bottom portion 11 has a sound hole 13 which make sound wave pass through. The carrying bottom portion 11 has therein a plurality of electrical connection structures 18, such as metal wirings and blind via holes (BVH), for electrical connection with the metal bumps 17 and the electrodes 15. Such package structure 1 is electrically connected to external components through the metal bumps 17. The sidewall 12 has an electrical conduction path formed thereon. The electrical conduction path comes in the form of a first metal layer 14, which is formed by means of blind via hole, electroplating, or copper paste filling. Metal bumps 16 are disposed on the top surface of the sidewall 12. The metal bumps 16 are electrically connected to the first metal layer 14.

The cover plate 20, which is shaped like a panel and made of an insulator (such as plastic, silicon-based or FR-4 materials), has a bottom surface coated with a second metal layer 21. The cover plate 20 covers the non-planar substrate 10 from above and connects to the sidewall 12. Such that the second metal layer 21 is electrically connected to the first metal layer 14 through the metal bumps 16 on the top surface of the sidewall 12. Hence, the MEMS microphone package structure 1 can be grounded through the non-planar substrate 10, and in consequence the first metal layer 14 and the second metal layer 21 form an electromagnetic shield. Besides, the top surface of the cover plate 20 can provide a plurality of conductive pads for electrical connection with external components.

It's noted that the cover plate 20 can also be provided in the form of a metal cover which is electrically connected to the first metal layer 14, so as to shield electromagnetic interference.

The sound wave transducer 30 corresponds in position to the sound hole 13 and connects to the top surface of the carrying bottom portion 11. ASIC 40 is mounted on the top surface of the carrying bottom portion 11 and located between the sound wave transducer 30 and the sidewall 12. The sound wave transducer 30 is electrically connected to the ASIC 40 by wire bonding. The ASIC 40 is electrically connected to the electrodes 15 on the top surface of the carrying bottom portion 11 by wire bonding.

With the sidewall 12 reinforcing the non-planar substrate 10, The carrying bottom portion 11 of the non-planar substrate 10 is thinner than its conventional counterpart to not only decrease the total thickness of the MEMS microphone package structure 1, but also increase the capacity of the back chamber without changing the appearance and dimensions of the MEMS microphone package structure 1. Furthermore, it enhance the acoustic performance of the MEMS microphone, such as the sensibility and signal-to-noise ratio of the sound perceived by the MEMS microphone. Besides, with the sidewall 12 being integrally formed on the carrying bottom portion 11, the structural strength of the non-planar substrate 10 increases further. Last but not least, an electrical conduction path is directly formed on the non-planar substrate 10, thereby dispensing with a complicated conventional process that involves in drilling holes in multiple printed circuit boards and in adhering to each other.

Figure 3:
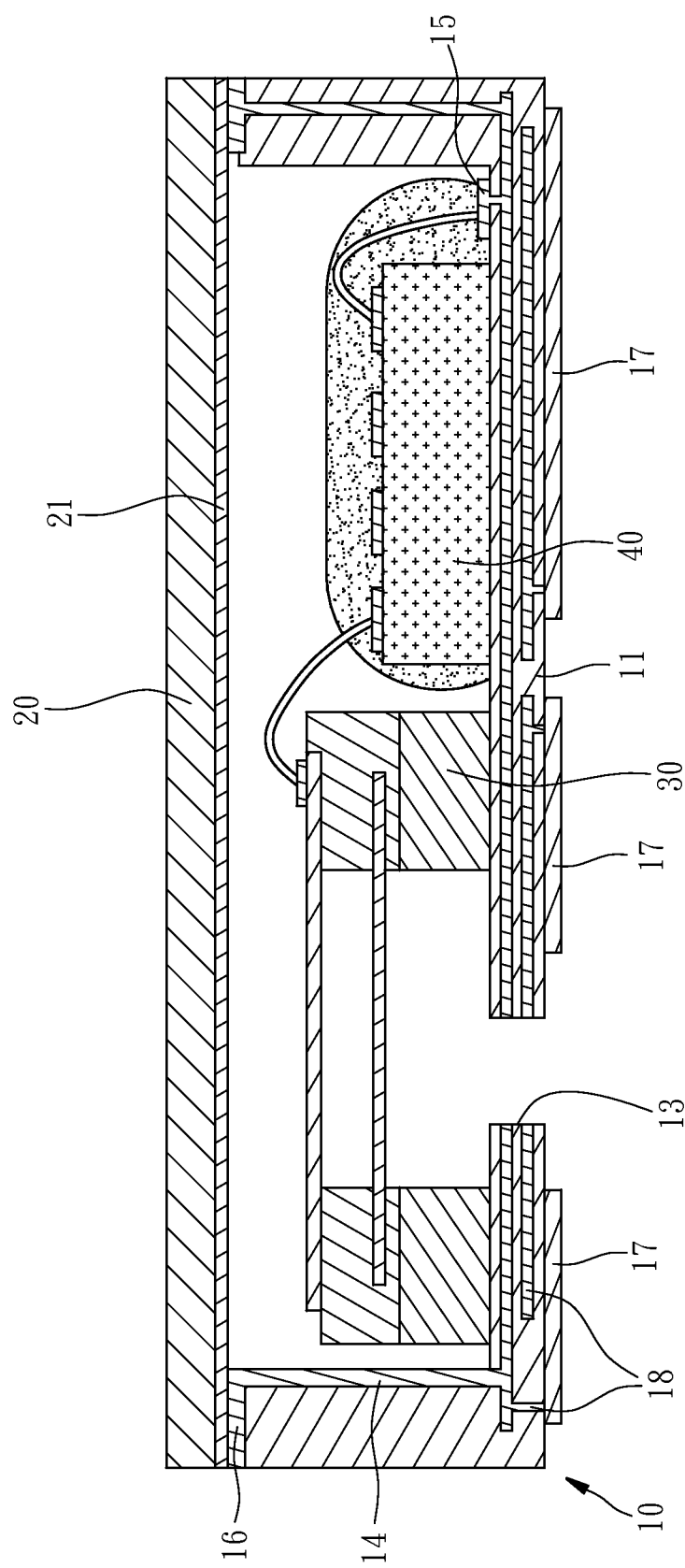
FIG. 3 is a cross-sectional view of the MEMS microphone package structure according to the second embodiment of the present invention.

Referring to FIG. 3, the present invention provides the second embodiment. The essential components of the second embodiment are substantially identical to that of the first embodiment except for the following technical features: at least a portion of the first metal layer 14 is electroplated to the internal surface of the sidewall 12; the top end of the first metal layer 14 is electrically connected to the metal bumps 16; and the bottom end of the first metal layer 14 is electrically connected to the carrying bottom portion 11. Hence, the second embodiment of the present invention enables the thinning of the carrying bottom portion 11 and electromagnetic interference shielding.

Figure 4:
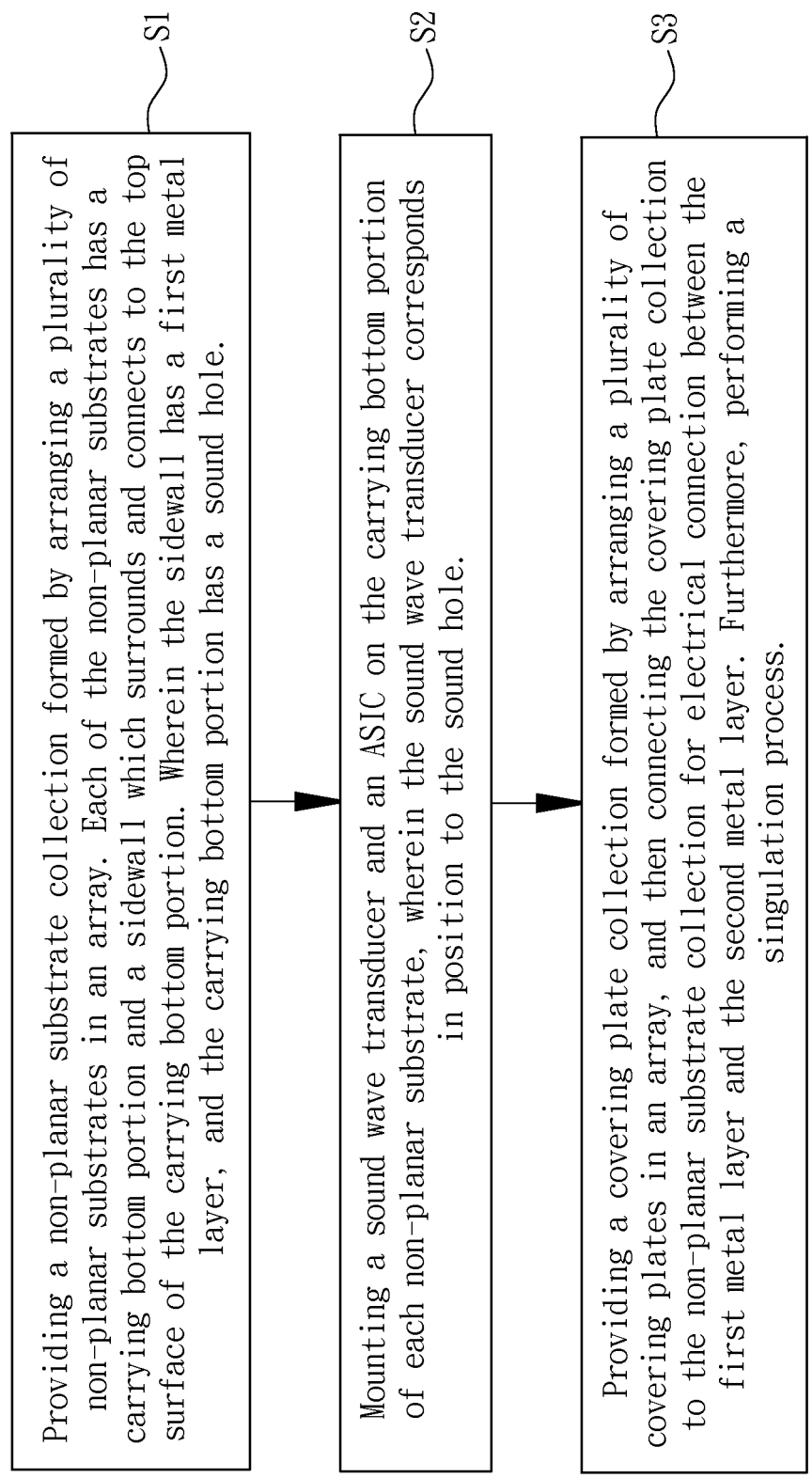
FIG. 4 is a flow chart of a method of manufacturing an MEMS microphone package structure according to the present invention.

Furthermore, the present invention has an advantage, that is, ease of mass production. Referring to FIG. 4, there is shown a flow chart of a method of manufacturing an MEMS microphone package structure according to the present invention. The process flow of the method of the present invention is described below.

Step S1: forming a non-planar substrate collection by arranging a plurality of non-planar substrates 10 in an array. The non-planar substrates 10 each have a carrying bottom portion 11 and a sidewall 12 which surrounds and connects to the top surface of the carrying bottom portion 11. The sidewall 12 has a first metal layer 14. The carrying bottom portion 11 has a sound hole 13. In step 51, with the non-planar substrate 10 being reinforced by the sidewall 12, the non-planar substrate collection manufactured in a single instance of the manufacturing process has a large surface area to therefore preclude warp and thus enhance process efficiency and cut production costs.

Step S2: mounting a sound wave transducer 30 and an ASIC 40 on the carrying bottom portion 11 of each non-planar substrate 10, wherein the sound wave transducer 30 corresponds in position to the sound hole 13, followed by electrically connecting the sound wave transducer 30 and the ASIC 40 by wire bonding, and electrically connecting the ASIC 40 and the carrying bottom portion 11 by wire bonding.

Step S3: providing a covering plate collection formed by arranging a plurality of covering plates in an array, connecting the covering plate collection to the non-planar substrate collection, electrically connecting the first metal layer 14 and the second metal layer 21, and performing a singulation process to cut apart each package structure 1 from the connected covering plate collection and non-planar substrate collection.

The constituent components disclosed in the aforesaid embodiments of the present invention are illustrative rather than restrictive of the scope of the present invention. All structural changes which persons skilled in the art can readily think of as well as replacements and changes of equivalent components must fall within the claims of the present invention.

What is claimed is:

1. A method of manufacturing an MEMS microphone package structure, the method comprising the steps of: (a) providing a non-planar substrate collection formed by arranging a plurality of non-planar substrates in an array, the non-planar substrates each having a carrying bottom portion and a sidewall surrounding and connecting to a top surface of the carrying bottom portion, the sidewall having a first metal layer, and the carrying bottom portion having a sound hole; (b) mounting a sound wave transducer and an application-specific integrated circuit (ASIC) on the carrying bottom portion of each said non-planar substrate provided in step (a), wherein the sound wave transducer corresponds in position to the sound hole; and (c) providing a cover plate collection formed by arranging a plurality of cover plates in an array, connecting the cover plate collection to the non-planar substrate collection, electrically connecting the first metal layer and the second metal layer, and performing a singulation process.

2. The method of manufacturing an MEMS microphone package structure as claimed in claim 1, wherein, in step (c), the cover plate collection is made of metal.

* * * * *